United States Patent [19]

Chatterjee

[11] 4,353,082
[45] Oct. 5, 1982

[54] BURIED SENSE LINE V-GROOVE MOS RANDOM ACCESS MEMORY

[75] Inventor: Pallab K. Chatterjee, Dallas, Tex.

[73] Assignee: Texas Instruments Incorporated, Dallas, Tex.

[21] Appl. No.: 820,179

[22] Filed: Jul. 29, 1977

[51] Int. Cl.³ .................. H01L 29/78; H01L 29/06; H01L 27/10; H01L 29/04

[52] U.S. Cl. .................................. 357/23; 357/24; 357/45; 357/55; 357/59; 357/89; 357/91; 365/183

[58] Field of Search ............... 357/24, 23, 45, 55, 357/59, 91; 307/238; 365/183

[56] References Cited

U.S. PATENT DOCUMENTS

| | | | |
|---|---|---|---|
| 3,720,922 | 3/1973 | Kosonocky | 357/24 |
| 3,740,732 | 6/1973 | Frandon | 357/24 |
| 3,852,800 | 12/1974 | Ohwada et al. | 357/24 |
| 3,997,799 | 12/1976 | Baker | 357/24 |
| 4,003,036 | 1/1977 | Jenne | 357/55 |
| 4,012,757 | 3/1977 | Koo | 357/24 |
| 4,060,738 | 11/1977 | Tasch et al. | 357/24 |
| 4,062,037 | 12/1977 | Togel et al. | 357/24 |

OTHER PUBLICATIONS

Electonics (Jan. 6, 1977), p. 2.
Baker "CCD Array Forms Random-Access Memory", Electronics (Nov. 13, 1975), pp. 138-139.
Dockerty, "Writing Scheme for a CCD Random-Access Memory Array", IBM Tech. Disclosure Bulletin, vol. 19, (7/76), p. 510.
Abbas et al., "Memory Cell Structure", IBM Tech. Disclosure Bulletin, vol. 18, (3/76), p. 3288.

*Primary Examiner*—Gene M. Munson
*Attorney, Agent, or Firm*—William E. Hiller; Melvin Sharp; Leo N. Heiting

[57] ABSTRACT

A random access memory device which is comprised of a matrix of individual MOS random access memory cells, the individual cells utilizing a sense region formed by a diffused layer of heavily doped silicon material underlying the storage and transfer regions, the storage region being formed at the surface of the device and containing a double implant for increasing the storage capacity of the cell, the transfer region being formed along the edge of a V-groove anisotropical etch which extends from the surface of the device adjacent the storage region and into the diffused sense region. In one embodiment first and second layers of polycrystalline silicon separated by an insulating layer and deposited at the surface of the cell act as the storage and transfer gates, respectively, the first layer overlying the storage region adjacent the V-groove and the second layer lying within the V-groove and partially overlapping the first layer. In a second embodiment, a single layer of polycrystalline silicon deposited on the surface of the cell and within the V-groove acts as both the storage and transfer gates.

5 Claims, 13 Drawing Figures

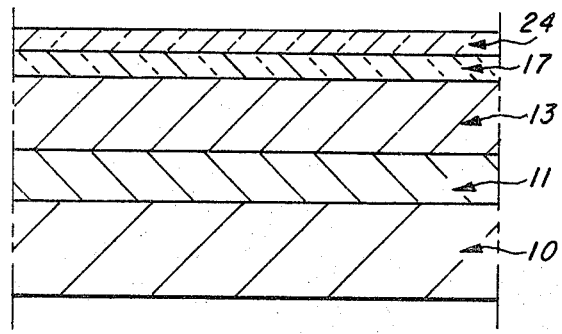
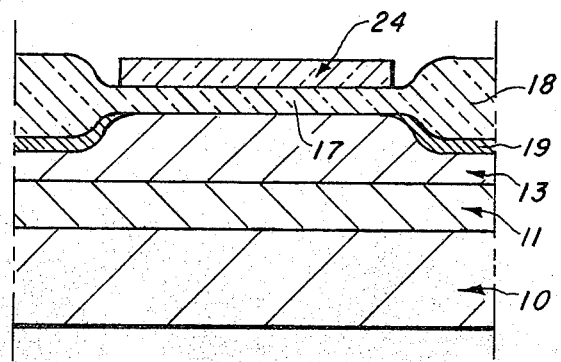
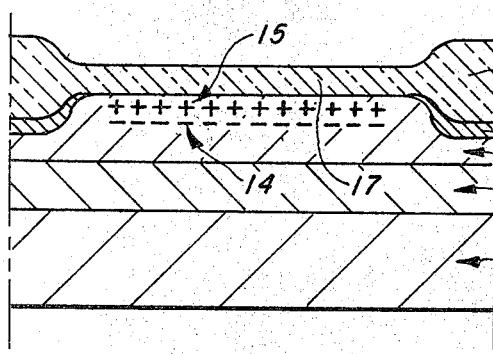
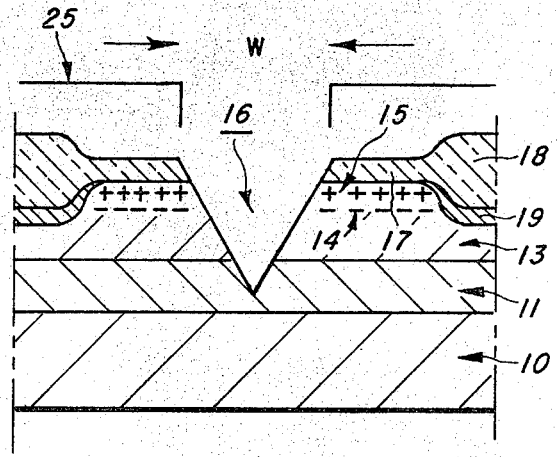
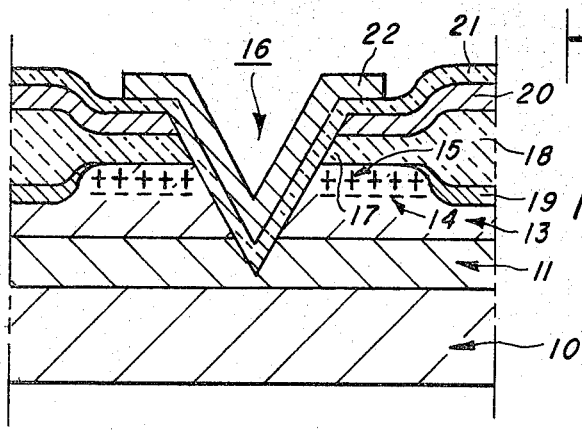

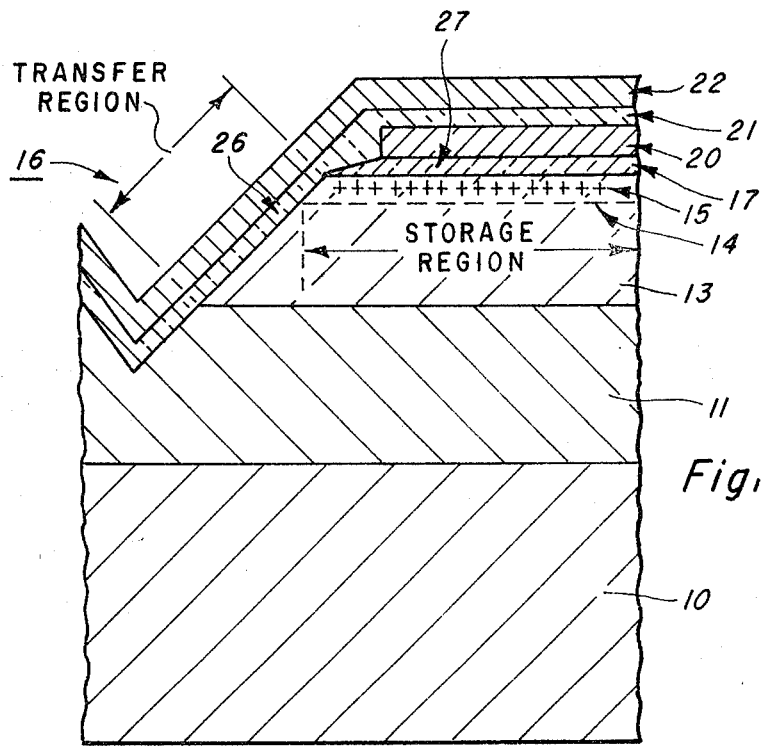
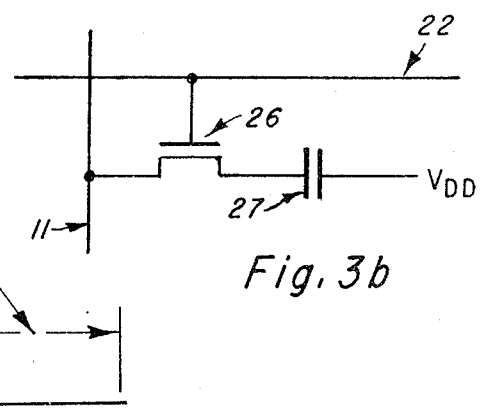
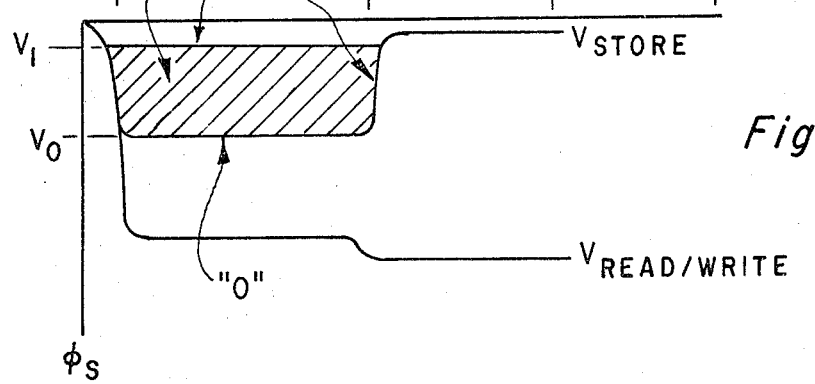

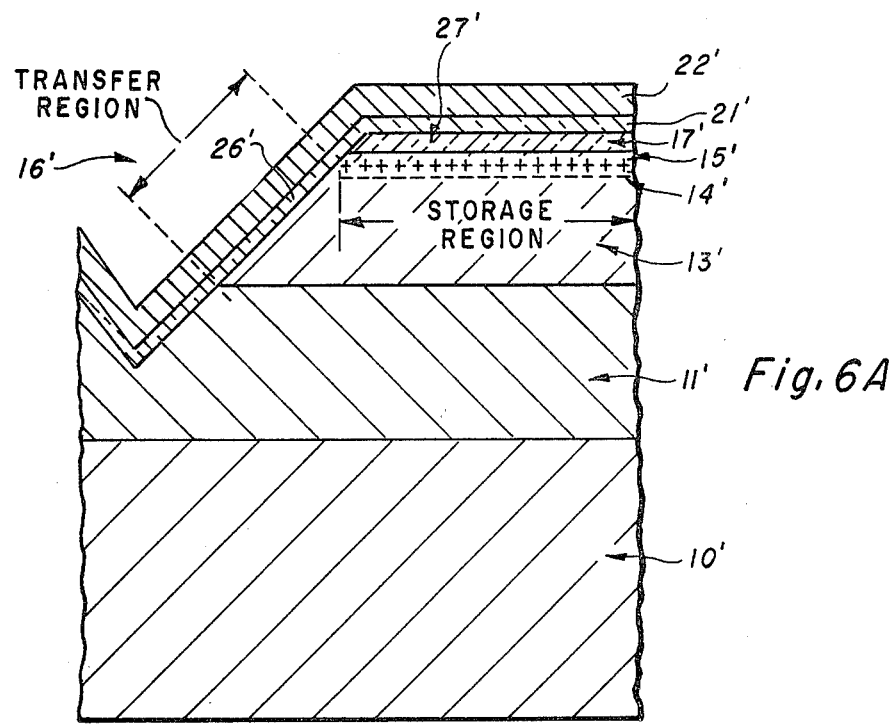
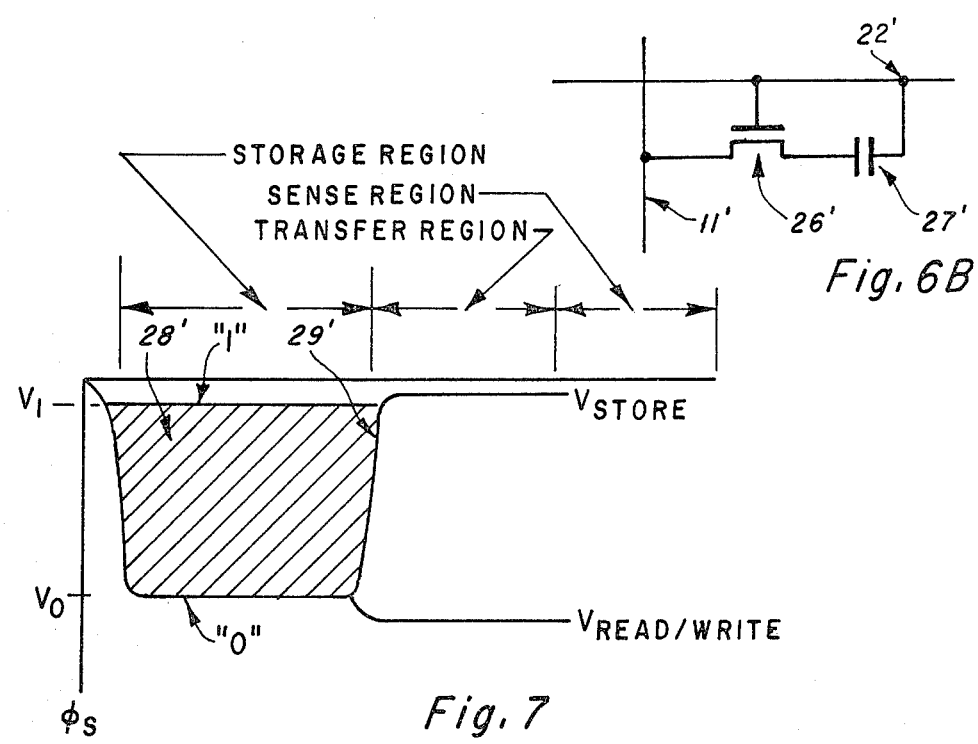

BURIED SENSE LINE V-GROOVE MOS RANDOM ACCESS MEMORY

BACKGROUND OF THE INVENTION

This invention relates to semiconductor memory devices and individual memory cells comprising components thereof and, more particularly, to a memory cell for a MOS random access memory (RAM) device which utilizes a buried sense line and a V-groove anisotropical etch to access it, thereby increasing the packing density of the RAM cells for the device.

The use of MOS random access memory devices is already extensive and continues to increase. Since the introduction of 1kbit MOS dynamic RAMs in 1970, development has progressed rapidly to the point that semiconductor memories are now preferred over core. Because most of the cost associated with the production of these memory devices derives from bonding, packaging, testing and handling, rather than from the production of the circuitry on the chip, recent development in this area has focused on methods for increasing the density of the memory cells contained on a given chip of silicon rather than on methods for increasing the efficient operation of the chip itself or on the simplification of the associated sensing and amplifier circuitry. Consequently 4 kbit RAMs are now in wide production, 16 kbit RAMs are becoming more common, and several semiconductor companies are expected to begin volume production of 64 and 256 kbit RAMs in the near future.

Several types of MOS RAMs are available; these devices fall into three broad categories. First, and most common, are the semiconductor memory cells of the one-transistor type such as that described in U.S. Pat. No. 3,909,631, issued Sept. 30, 1975 to N. Kitagawa, and pending applications Ser. No. 648,594, filed Jan. 12, 1976 by C-K. Kuo and Ser. No. 691,735 filed June 1, 1976 by White, McAdams and Redwine, now U.S. Pat. No. 4,081,701 issued Mar. 28, 1978. The one-transistor cell is also described in detail in Electronics, Sept. 13, 1973 at pp. 116–121 and Electronics, May 13, 1976 at pp. 81–86. The second type of semiconductor memory cell is the MOS RAM cell concept which utilizes double level polysilicon gates, such as that described in pending application Ser. No. 803,495, filed June 6, 1977 by C-K. Kuo. Finally, a third type of MOS RAM is the so-called charge coupled RAM, such as that disclosed in pending application Ser. No. 554,889, filed Mar. 3, 1975 by Al F. Tasch, Jr. et al abandoned in favor of continuation application Ser. No. 739,758 filed Nov. 8, 1976, now U.S. Pat. No. 4,060,738 issued Nov. 29, 1977 and which is described in the *IEEE Journal of Solid State Circuits*, Vol. SC-11, No. 1 (February 1976), pp. 58–63, and in *IEEE Journal of Solid State Circuits*, Vol. SC-11, No. 5 (October 1976), pp. 575–585.

Although each of these types of prior art MOS RAMs differ in operational characteristics and each has its own advantages and disadvantages, certain structural features are common to all conventional MOS RAMs. A one-transistor MOS RAM cell and a double-level polysilicon MOS RAM cell are shown in FIGS. 10A and B respectively at p. 583 of the *IEEE Journal of Solid State Circuits*, Vol. SC-11, No. 5 (October 1976). A charge coupled MOS RAM is shown in FIG. 1A of the same article at p. 575. As indicated in these figures, the cell is usually fabricated on a block of P type silicon substrate material and utilizes a bit (or sense) line of diffused N+ material near the surface of the device and separated from the transfer gate by a layer of silicon dioxide. The cells are all fabricated so that there is a storage region, formed by a small geometry capacitor, and a transfer region, formed by a small geometry transistor, adjacent to each other near the surface of the device, the transfer region being laterally disposed between the N+ diffused sense line and the storage region. The transistor thus connects the sense line and the storage region and provides selective isolation between the two. A binary "1" may be written into the RAM cell by pulsing the transfer gate, thereby turning on the transistor, and allowing charge to collect on the capacitor. A binary "0" may be similarly written into the cell by not allowing charge to flow into the capacitor. The transistor may then be turned off to store the information. The charge or absence thereof may be detected by the sense line in conjunction with selective clocking of the transfer gate. The physical structure of these prior art RAM cells has several inherent disadvantages.

First, because the N+ bit line diffusion in conventional RAMs is performed as a later step in the fabrication process, the doping level of this layer is limited because the heating required to introduce a high level of impurities at this step could interfere with impurity levels which have already been introduced at the surface of the device, as in the case of the double implant at the surface of a charge coupled MOS RAM cell. However, it is desirable to make the impurity level in the sense line layer as high as possible in order to reduce the sheet line resistance of the sense line, since a decrease in the sheet line resistance results in a reduction of the RC time constant which is associated with the sense line and which is a limitation on the data rate available therethrough.

Second, because the sense line in conventional RAMs is near the surface of the device and is separated from the transfer gate by only a thin layer of silicon dioxide, the clocking of the transfer gate introduces small voltages along the sense line because of the capacitive coupling between the gate and the sense line which must be filtered by the external amplifier circuitry in order to avoid errors in the operation of the device.

Because the storage region must be logically connected with the sense line through the transfer region, these regions are conventionally fabricated next to each other at the surface of the chip, the result being an inherent loss in density, which is limited by the sum of the physical widths of the three regions.

In addition, fabrication complexity is introduced by the use of the charge coupled RAM concept, which utilizes a double implant of P and N type impurities at the surface of the device, as shown in FIG. 1, page 575 of the article appearing in the *IEEE Journal of Solid State Circuits*, Vol. SC-11, No. 5 (October 1976). As described in the discussion of that figure, the storage region contains a shallow N type ion implant and a relatively deeper P type ion implant while the transfer region is free of implants. It is critical that the edge of the P type implant at the boundary of the two regions either coincides with or lies inside of the N type implant in order to avoid a potential barrier in the transfer region which would destroy the read/write operation of the cell. Failure to properly align these regions results in a defective device, and the alignment tolerance is therefore a critical measure of reliability in the fabrication process of a conventional charge coupled RAM cell.

SUMMARY OF THE INVENTION

Briefly, individual memory cells for a RAM device in accordance with the present invention utilize a doped region of silicon as the sense line, this region being deeply embedded within a silicon substrate of the opposite conductivity type. This operation is performed as the first step in the fabrication process, thereby permitting the use of a high level of impurities in the sense region. The transfer region of the device is formed by an anisotropically etched V-groove which extends into the buried sense line region, and a layer of polycrystalline silicon deposited within the V-groove forms the transfer gate, or word line for the device. The storage region is formed at the surface of the device by a layer of polycrystalline silicon deposited thereon, the surface of the device being modified by a double implant of N and P type ion impurities which increase the charge capacity of the cell. The storage region is logically connected with the sense line by the transfer region formmed along the wall of the V-groove. Since the sense region is located below the surface of the device away from the storage gate, clock feedthrough is virtually eliminated and the design of the external sense amplification circuitry may therefore be greatly simplified. Density of the cells is vastly improved by virtue of the fact that the sense line is located beneath the transfer and storage regions rather than adjacent thereto at the surface of the cell and also because the transfer region is formed partly within the surface of the device along the edge of the V-groove rather than laterally along its surface. It has been found that the storage area/cell area ratio is thereby improved by a factor of two over the smallest conventional MOS RAM cells. An additional advantage is gained by the V-groove etch, which automatically aligns the implants at the boundary of the storage and transfer regions, thus greatly simplifying the fabrication of the RAM cell of this embodiment. Finally, since the operational characteristics of this RAM cell are identical to those of conventionally fabricated RAM cells, no modification in voltage levels or circuit elements is required.

BRIEF DESCRIPTION OF THE DRAWINGS

FIGS. 2A to E are cross-sectional views of an individual MOS RAM cell according to the first embodiment of the present invention in various stages of the fabrication process, FIG. 3A is a close-up cross-sectional view of a MOS RAM cell according to the first embodiment of the present invention and depicts certain operational regions therein, while FIG. 3B is an electrical schematic diagram of the cell of FIG. 3A, FIG. 4 is a graphical representation of the surface potential within the operational regions of the cell of FIG. 3A corresponding to the logical operations of reading, writing and storing information in the cell, FIG. 6A is a close-up cross-sectional view of a MOS RAM cell according to the second embodiment of the present invention and depicts certain operational regions therein, while FIG. 6B is an electrical schematic diagram of the cell of FIG. 6A.

FIG. 7 is a graphical representation of the surface potential within the operational regions of the cell of FIG. 6A corresponding to the logical operations of reading, writing and storing information in the cell.

DETAILED DESCRIPTION OF THE DRAWINGS

Figure 1:
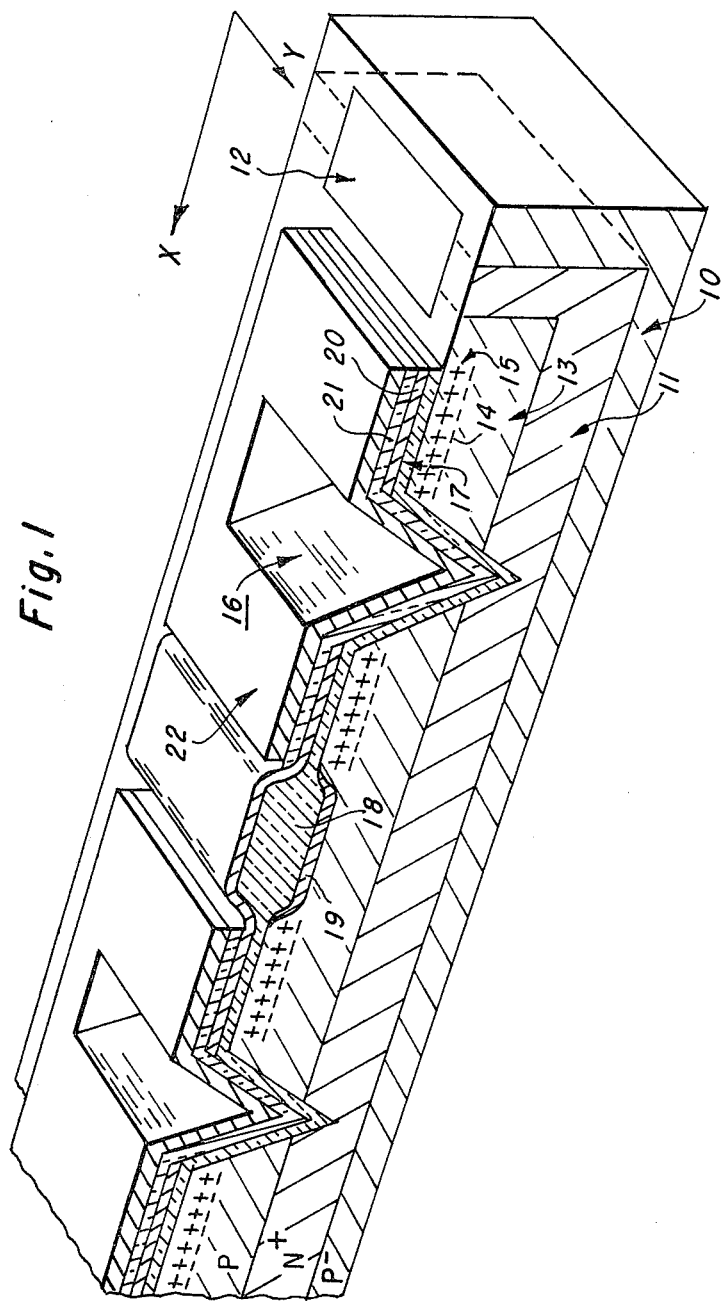
FIG. 1 is a perspective cross-sectional view of a part of the random access memory device containing a plurality of individual MOS RAM cells according to first embodiment of the present invention.

Referring now to the drawings, FIG. 1 is a perspective cross-sectional view of a random access memory device having a plurality of MOS RAM cells according to the first embodiment of the present invention. Only a part of the random access memory device is shown in FIG. 1, and it is to be understood that the device is defined by a matrix of individual MOS RAM cells. The cells extending in the X direction, as defined by the directional arrow in FIG. 1, form rows of the cell matrix and share a common buried bit or sense line 11 defined by a diffused region of N+ silicon which extends to the surface of the device at one edge thereof and which terminates at a region 12 on the surface of the device, region 12 containing the sense amplifier and bonding regions for insuring electrical access to the cells fabricated along the X direction and connected by the common sense line 11. The cells extending in the Y direction, as defined by the directional arrow in FIG. 1, are formed within common V-grooves 16 and form columns of the cell matrix which share common storage gates 20 and transfer gates 22, the former being formed by a first layer of polycrystalline silicon deposited on the surface of the device adjacent the V-grooves 16, and the latter being defined by a second layer of polycrystalline silicon deposited within the V-grooves 16. The device is fabricated on a layer of P-channel silicon substrate 10 which may be lightly doped in order to reduce the capacitance along the common sense line 11, as will be described in greater detail hereinafter. The common sense line 11 is formed by diffusing into substrate material 10 a layer of N+ donor impurities. The doping in this layer is very high, perhaps on the order of $10^{20}/cm^3$, in order to reduce the sheet resistance of the common sense line 11, as will be described in greater detail hereinafter. A P-channel epitaxial layer 13 overlies the common sense line 11, the layer 13 being grown on the substrate 10 by methods well known in the art. The surface of epitaxial layer 13 is modified by a double implant of P-type ions 14 and N-type ions 15, the P type implanted region being a relatively deep implant (3,000–10,000 Å) and the N-type implanted region being relatively shallow (500–1500 Å). The individual columns of cells are formed by anisotropically etched V-grooves 16 which extend through the epitaxial layer 13 in the Y direction and into the common sense line 11. Relatively thin insulating surface layers of silicon dioxide 17 are deposited along the surface of the device. Silicon dioxide layers 17 are uniform in thickness in the area of the individual cells but also contain frame-shaped thickened portions defining field oxide regions 18 which separate the columns of cells defining the random access memory device. Beneath the thickened field oxide regions 18 are P+ doped layers 19 forming channel stop layers. First layers of polycrystalline silicon 20 which form the storage gates for the cells are deposited on the insulating layers 17 between successive V-grooves 16 on the surface of the device. Second insulating layers of silicon dioxide 21 separate the first layers of polycrystalline silicon 20 and second layers of polycrystalline silicon 22 which are deposited within the V-grooves 16 of the device. Second layers 22 extend to and terminate at the edges of thickened oxide portions 18 but do not connect the columns of cells.

The structure of the individual cells of the random access memory device and the method of manufacture thereof is depicted in FIGS. 2A to E which show cross-sectional views of an individual MOS RAM cell in various stages of the manufacturing process. Although FIG. 2A shows that the MOS RAM cell is fabricated on a substrate layer 10 of P channel silicon, it is to be understood that N channel silicon could also be used, with corresponding changes in the channel orientation of the successive layers. Substrate layer 10 has diffused along its top planar surface a region 11 of N+ ions which forms the sense region for the MOS RAM cell. The donor concentration level of the sense region 11 is relatively high, perhaps on the order of $10^{20}$ impurities/$cm^3$. Substrate layer 10, on the other hand, is lightly doped. The junction between the sense line region 11 and the substrate material 10 forms a diode with an inherent capacitance; since it is necessary to propagate electrical signals through sense region 11 as quickly and with as little degradation as possible, and since the ability to do so is limited by the RC time constant associated with the junction, it is desirable to reduce both the capacitance associated with the PN junction and the resistance of the sense region 11. This is accomplished by reducing the doping level of the substrate material 10, thereby increasing the width of the space charge region of the PN junction, and increasing the doping level of the sense region 11, thereby increasing the number of electrons available for conduction within sense line region 11. As shown in FIG. 2A, an epitaxial layer 13 is grown along the top planar surface of substrate material 10 and over diffused sense region 11. A relatively thin insulating layer 17 of silicon dioxide ($SiO_2$) is deposited along the top planar surface of epitaxial layer 13, and a layer 24 of silicon nitride ($Si_3N_4$) is deposited on the top planar surface of insulating layer 17. Next, as shown in FIG. 2B, layer 24 is masked and partially etched away in order to leave a device-defining region of layer 24 intact and overlaying a portion of the surface of the device. A heavily doped region of P type material 19 is implanted within epitaxial layer 13 which acts as a channel stop region and may be used to electrically isolate adjacent cells on the surface of a MOS random access memory device. Device-defining layer 24 prevents the implanting of P type material 19 thereunder, so that the channel stop region lies beneath the surface of epitaxial layer 13 surrounding layer 24. A relatively thick field oxide 18 is grown on the surface of the device over channel stop region 19 and surrounding device-defining silicon nitride layer 24, the silicon nitride inhibiting the growth of the field oxide 18. Relatively thick field oxide layer 18 defines the boundary of the MOS RAM cell and may be used to isolate adjacent cells on the surface of a MOS random access memory device. As shown in FIG. 2C, device-defining silicon nitride layer 24 is next removed and the surface of epitaxial layer 13 is modified by a relatively deep implant (3,000–10,000 Å) of P-type material 14, represented by the minus signs in FIG. 2C, and a relatively shallow implant (500–1,500 Å) of N-type material 15, represented by the plus signs in FIG. 2C. The relatively deep P-type implant 14 is characteristically boron ions and the relatively shallow N-type implant 15 is characteristically arsenic ions, although other suitable elements could be used. The implants are made using implant techniques well known in the art, such as that described in copending application Ser. No. 740,528, filed Nov. 10, 1976 by Al F. Tasch, Jr. The relatively thick field oxide layer 18 prevents the implantation process from depositing the N and P dopants thereunder, so that the cell is selectively formed within the boundaries of field oxide layer 18. The double implant of P type material 14 and N type material 15 at the surface of epitaxial layer 13 modifies the surface potential and enhances the capacitance of the storage region of the cell, as will be described in greater detail hereinafter. As shown in FIG. 2D, a mask 25 containing a window of width W is used in conjunction with a suitable etching solution to define a V-groove 16 which extends into the surface of the cell within the area bounded by field oxide layer 18, V-groove 16 extending through epitaxial layer 13 and terminating within diffused sense region 11. V-groove 16 is formed by an anisotropic etch, as explained in copending application Ser. No. 763,780, filed Jan. 31, 1977 by G. R. Mohan Rao et al. The <100> crystalline face of P type silicon epitaxial layer 13 etches to expose the <111> planes which are at an angle of 54.7° with respect to the <100> planes. The etch, which usually employs hydrazine, is self-stopping and the depth of V-groove 16 is therefore exclusively determined by W, the width of the window in mask 25. Consequently window width W may be selected so as to assure the termination of V-groove 16 within sense region 11, depending on the thickness of epitaxial layer 13. As shown in FIG. 2E, a first layer of polycrystalline silicon is selectively deposited, using photoresist, on the surface of the cell adjacent to V-groove 16 but not within the groove, the thickness of first layer of polycrystalline silicon 20 being approximately 0.5 micron. A second insulating layer 21 of silicon dioxide is grown along the entire surface of the cell, covering first layer of polycrystalline silicon 20 and lying within V-groove 16, second layer of silicon dioxide 21 having a thickness of approximately 2,000 Å. Finally, a second layer of polycrystalline silicon 22 is deposited within V-groove 16 and overlying oxide layer 21, the second layer of polycrystalline silicon 22 being selectively deposited, using photoresist, along the surface of the cell at a thickness of 0.5 micron within V-groove 16 and inside the region defined by thick oxide layers 18. The first layer of polycrystalline silicon 20 acts as the storage gate of the MOS RAM cell, while the second layer of polycrystalline silicon 22 acts as the transfer gate of the MOS RAM cell. Finally, electrodes may be attached to the gates and the sense region 11 by means of well-known metallization techniques in order to gain electrical access to the cell.

The relationship between the structural features of the MOS RAM cell of this embodiment and the circuit analog of a MOS RAM is shown in FIGS. 3A and 3B, the former being a partial cross-sectional view of an individual MOS RAM cell according to this invention and the latter being an electrical schematic diagram of the same. As indicated in FIG. 3A, the storage region of the MOS RAM cell according to the present invention is within the epitaxial layer 13 at the surface thereof adjacent V-groove 16; the first layer of polycrystalline silicon 20 acts as one plate of a capacitor 27, the first layer of silicon dioxide 17 acts as the dielectric, and the surface of epitaxial layer 13 acts as the second plate of capacitor 27. The double implant at the surface of the epitaxial layer 13 defined by the deep implant of P-type material 14 and the shallow implant of N-type material 15 effectively acts as a second capacitor and increases the charge capacity of the cell, as explained in copending application Ser. No. 740,528, filed Nov. 10, 1976, by Al F. Tasch, Jr., As indicated in FIG. 3A, the transfer region of the MOS RAM cell according to the present invention is within the epitaxial layer 13 along the sloping side of V-groove 16 and extends from the surface of the cell adjacent to V-groove 16 to sense region 11, a MOS transistor 26 being defined by the second layer of polycrystalline silicon 22, which acts as the gate of transistor 26, the second layer of silicon oxide 21 and epitaxial layer 13. As shown in the electrical schematic diagram of FIG. 3B, which is recognized to be the circuit analog of a MOS RAM cell, the transistor 26 formed within V-groove 16 electrically connects sense line 11 with storage capacitor 27. Sense line 11 is electrically connected with the drain (or source) of transistor 26, the source (or drain) of transistor 26 is electrically connected with one plate of storage capacitor 27, and the other plate of storage capacitor 27, which is the storage gate formed by the first layer of polycrystalline silicon 20, is attached to a reference potential $V_{dd}$ in order to insure that storage capacitor 27 is biased at the proper potential for accepting and storing information through access transistor 26, as will be described in more detail hereinafter. When a plurality of these MOS RAM cells are fabricated into a matrix of cells as in the MOS random access memory device of FIG. 1, the second layer of polycrystalline silicon 22 acts as the word line for a column of cells while sense region 11 acts as the bit (or sense) line for a row of cells.

The operation of the MOS RAM cell of this invention is described in FIG. 4, which is a graph of the surface potentials of the storage region, the transfer region, and the sense region corresponding to the operations of read, write and store. It is to be understood that the operation of the MOS RAM cell of the present invention is similar to that described in *IEEE Journal of Solid State Circuits,* Vol. SC-11, No. 1 (February 1976), pp. 60–61 of that article, which is incorporated into this specification by reference. The voltages and timing used to operate this MOS RAM cell are the same as those used to operate conventional RAM cells of the one-transistor type. The first level of polycrystalline silicon 20 is maintained at a reference voltage $V_{dd}$, so that the underlying storage region contains a potential well 28, shown in FIG. 4, a potential barrier 29 existing at the interface between the storage and transfer regions by virtue of the implanted layers 14 and 15 in the former and the lack of implants in the latter. To write a binary "1" into the cell, sense region 11 is maintained at or near zero potential while the transfer gate, second layer of polycrystalline silicon 22, is brought to a high voltage, $V_{read/write}$. This causes the surface potential of the transfer region to rise as illustrated in FIG. 4. The low voltage in sense region 11 causes electrons to flow through the transfer region into the storage region, thereby decreasing the surface potential in the storage region to $V_1$ as indicated in FIG. 4. If it is desired to write a binary "0" into the cell, the same sequence is performed, except that the voltage in sense region 11 is set at a high level, thereby insuring that no charge enters the storage region through the transfer region. The surface potential of the storage region is thus preserved at a high level $V_0$ as indicated in FIG. 4. To store data within the storage region, the transfer gate, second layer of polycrystalline silicon 22, is returned to a low voltage so that the surface potential in the transfer region decreases to a low level, $V_{store}$ as indicated in FIG. 4. The result of this sequence is the opening and closing of the potential well defined by the potential barrier 29 at the interface between the storage and transfer regions, a binary "1" being represented by a stored charge in the potential well 28 within the storage region and a binary "0" being represented by an absence of charge in the potential well. To read information stored in the cell, the transfer gate, second layer of polycrystalline silicon 22, is again brought to a high voltage $V_{read/write}$, thereby eliminating potential barrier 29 so that any charge present in the storage region may pass through the transfer region into sense region 11. If charge does flow into sense region 11, the sense circuitry within region 12 of FIG. 1 which is connected thereto will amplify the signal and indicate the presence of a binary "1". Conversely, an absence of charge on sense region 11 indicates the presence of a binary "0". It is readily recognizable that the operations of writing, storing and reading are simply the result of turning transistor 26 of FIG. 3B on and off by means of clocking transfer gate 22 so that voltage supplied to and from sense line 11 can flow to and from capacitor 27.

Figure 5:
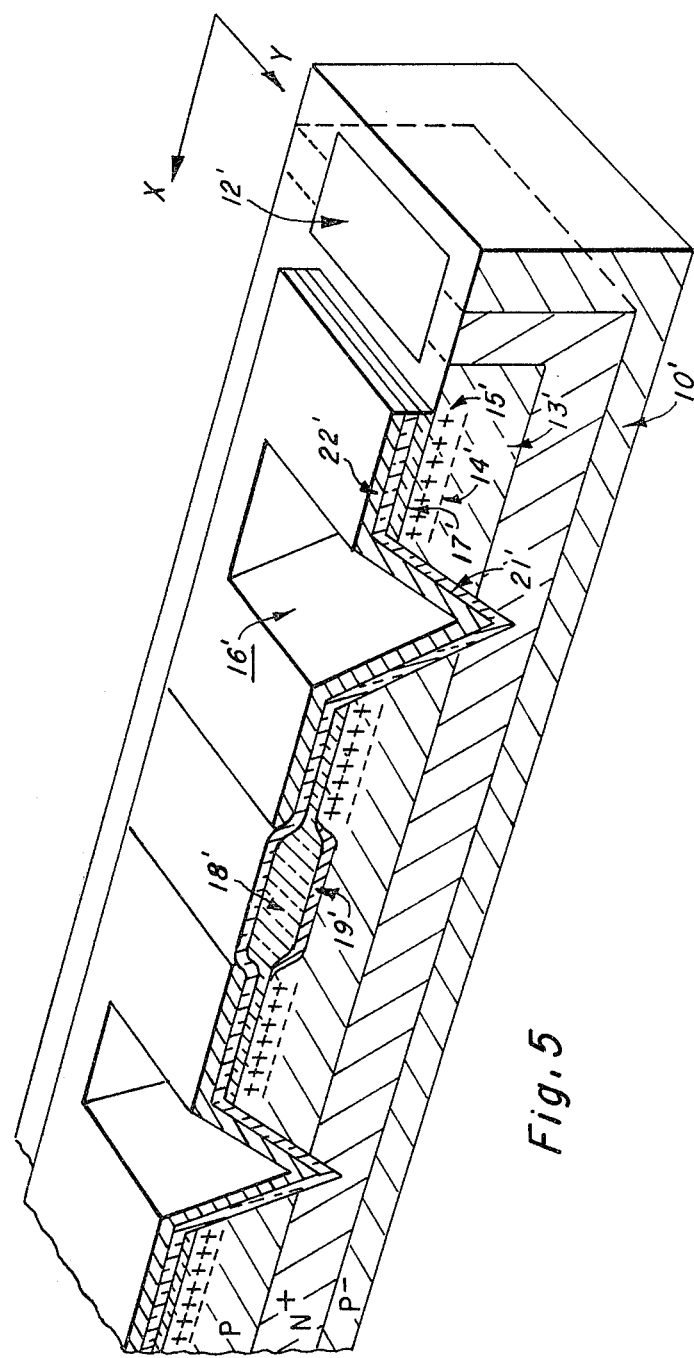
FIG. 5 is a perspective cross-sectional view of a part of a random access memory device containing a plurality of individual MOS RAM cells according to the second embodiment of the present invention.

FIG. 5 is a perspective cross-sectional view of a random access memory device having a plurality of MOS RAM cells according to the second embodiment of the present invention fabricated thereon. As in the case of the device shown in FIG. 1, only a part of the device is shown in FIG. 5, and it is to be understood that the device is defined by a matrix of independent MOS RAM cells, the independent rows of cells extending in the X direction and the independent columns of cells extending in the Y direction as indicated by the respective directional arrows in FIG. 5. A study of FIG. 5 in conjunction with FIG. 1 will indicate that the structural features of the device of FIG. 5 are quite similar thereto, and the same reference numerals with the prime notation added have been used in FIG. 5 to identify common elements. In the device of FIG. 5, however, a single layer of polycrystalline silicon 22 defines both the storage and transfer gates within each column of cells. As shown in FIG. 5, polycrystalline silicon layer 22' is deposited on the surface of the device between successive thickened oxide layers 18' and within the common V-grooves which define the columns of cells for the matrix of the device. The manufacturing process for the fabrication of the individual cells of this second embodiment is also similar to that for the first embodiment; after the anisotropic etch which creates V-groove 16' is performed, an insulating layer of silicon dioxide 21' is deposited on the surface of the cell and the layer of polycrystalline silicon 22' is deposited over silicon dioxide layer 21'. Metallization is performed to deposit electrodes as in the first embodiment.

FIG. 6A is a cross-sectional view of the MOS RAM cell of the second embodiment of the present invention. As in the first embodiment, the storage region is located at the surface of the cell adjacent V-groove 16' within epitaxial layer 13' at the site of the double implant of P-type impurities 14' and N-type impurities 15'. The transfer region of the cell of the second embodiment is located, as in the first embodiment, along the inclined edge of V-groove 16' so that the storage region is formed by capacitor 27' which is connected to diffused sense region 11' by a transistor 26' formed within the V-groove. The electrical schematic diagram for this RAM cell of the second embodiment is shown in FIG. 6B. As indicated in FIG. 6B, both capacitor 27' and transistor 26' are connected to word line 22' formed by the common polycrystalline silicon layer overlying both the transfer and storage regions of the MOS RAM cell of the second embodiment.

The operation of the MOS RAM cell of the second embodiment is similar to that of the first embodiment, and is described by the surface potential diagram of FIG. 7. To write a binary "1" into the cell, sense region 11' is maintained at or near zero potential and the word line, polycrystalline silicon layer 22', is brought to a high voltage, $V_{read/write}$. This causes the surface potential of both the transfer and storage regions to rise as shown in FIG. 7. The low voltage on sense line region 11' causes electrons to flow through the transfer region into the storage region, thereby decreasing the surface potential in the storage region to $V_1$. If it is desired to write a binary "0" into the cell, the same sequence is performed, except that the voltage in sense region 11' is set at a high level, so that no charge enters the storage region through the transfer region, and the surface potential of the storage region is thus preserved at a high level $V_0$ as indicated in FIG. 7. To store data within the storage region, the word line, polycrystalline silicon layer 22', is returned to a low voltage so that the surface potential in the transfer region decreases to a low level $V_{store}$ as indicated in FIG. 7. The surface potential within the storage region does not automatically decrease as a result of this sequence because of the double implant therein. As described at page 60 of the article appearing in *IEEE Journal of Solid State Circuits*, Vol. SC-11, No. 1 (February 1976), the double implant shifts the surface potential characteristic and creates a potential well in the storage region, the double implant performing the same function as reference potential $V_{dd}$ in the operation of the RAM cell of the first embodiment. Thus, as in the first embodiment, the clocking sequence described results in the opening and closing of the potential well 28' defined by the potential barrier 29' at the interface between the storage and transfer regions (FIG. 7), a binary "1" being represented by a stored charge in the potential well 28' within the storage region and a binary "0" being represented by an absence of charge in the potential well. The reading of information stored in the cell is accomplished by elimination of potential barrier 29' by means of increasing the voltage on the word line, polycrystalline silicon layer 22', thereby allowing the flow of charge from the storage region to the sense region 11', an absence of such charge representing a binary "0" and the presence of such charge representing a binary "1" as in the first embodiment.

The random access memory device of the present invention also has several advantages over those of the prior art in terms of fabrication. Conventional dynamic RAM cells using self-aligned gate technology require the row of transfer gates to be connected by a metal line. Since the gate cannot cross the diffused sense line this requires a metal to polysilicon contact shared by two cells. The dynamic RAM cell described here allows the polysilicon word line to cross over the sense line so that no contact openings are required. This results in both higher yield and greater reliability.

The MOS RAM cell of the second embodiment has several additional advantages; it is easier to fabricate since only one level of polycrystalline silicon is used as both the transfer and storage gates, and it is more convenient to operate, since the voltage $V_{dd}$ is no longer required. As in the case of the first embodiment, the clocking and voltage levels are identical to those used in the one-transistor cells, so that this RAM cell may also be conveniently incorporated into already existing systems. As various changes in addition to those mentioned could be made to the structures described without departing from the scope of the invention, it is intended that all matter contained in the above description and shown in the accompanying drawings shall be interpreted as illustrative and not in a limiting sense.

What is claimed is:

1. A memory cell for a semiconductor memory device comprising in combination:
    a substrate of silicon material of one conductivity type having a top surface which is at least partially planar;
    capacitance means formed at said planar surface and including a layer of polycrystalline silicon which is separated from said surface by a relatively thin silicon dioxide insulating layer and further including a storage region within said surface underlying said layer of polycrystalline silicon;
    said silicon substrate being provided with a V-groove formed in the top surface thereof, said V-groove being located adjacent said storage region and the bottom of said V-groove extending into said silicon substrate;
    transistor means forming a transfer region within said silicon substrate and being defined in a side wall of said V-groove by said layer of polycrystalline silicon lying within said V-groove and separated from said side wall thereof by a relatively thin silicon dioxide insulating layer, said transfer region including a source to drain path located within said silicon substrate adjacent said side wall of said V-groove, said storage region being located at one end of said path; and
    a sense region formed by a heavily doped region of the opposite conductivity type with respect to said silicon substrate and embedded within said silicon substrate so as to underlie said storage region and said transfer region, the bottom of said V-groove contacting said sense region, and said sense region being located at the other end of said source to drain path.

2. A memory cell according to claim 1, wherein said capacitance means further includes, within said storage region thereof, a double implant of P-type and N-type ions located within said top planar surface of said silicon substrate, said P-type ion implant being located at a relatively great depth within said surface and said N-type ion implant being located at a relatively shallow depth within said surface.

3. A random access memory device utilizing a matrix array of individual memory cells having orthogonally related word lines and sense lines, comprising in combination:
    a lightly doped body of silicon material of one conductivity type and having a top surface which is at least partially planar;
    a plurality of capacitance means formed at said planar surface, each of said capacitance means being partially formed by an elongated strip of polycrystalline silicon deposited on said surface of said body of silicon material and insulated therefrom by a relatively thin silicon dioxide insulating layer, each of said elongated strips of polycrystalline silicon forming the storage gate for a plurality of cells defining a respective column of cells within said matrix of cells, said insulating layer defining the gate oxide, and said capacitance means further including storage regions within said surface underlying each of said elongated strips of polycrystalline silicon;

said body of silicon material being provided with a plurality of parallel V-grooves in said top planar surface thereof, each of said V-grooves being located adjacent a corresponding one of said storage regions and the bottoms of said V-grooves extending into said body of silicon material;

a plurality of transistor means forming a plurality of transfer regions within said body of silicon material, each of said transistor means being defined in a side wall of a corresponding V-groove by a corresponding one of said elongated strips of polycrystalline silicon lying within the corresponding V-groove and separated from said side wall thereof by a relatively thin silicon dioxide insulating layer, each of said transfer regions including a source to drain path located within said body of silicon material adjacent the side wall of the corresponding V-groove, a respective storage region being located at one end of said path of the corresponding transfer region;

a plurality of sense regions formed by heavily doped regions of the opposite conductivity type with respect to said silicon body, said heavily doped regions being in the form of spaced elongated layers embedded within said body of silicon material in orthogonal relationship to said elongated strips of polycrystalline silicon and underlying said storage regions and said transfer regions, the bottoms of said plurality of V-grooves contacting each of said spaced elongated layers of heavily doped regions, each of said sense regions being located at the other end of the source to drain path of said transfer region corresponding thereto; and the sense regions included in each one of the embedded elongated layers forming the sense lines for a plurality of cells defining respective rows of cells within said matrix of cells, and the elongated strips of polycrystalline silicon forming the word lines for a plurality of cells defining respective columns of cells within said matrix of cells.

4. A memory device according to claim 3, further including respective sense amplifiers on said planar surface of said body of silicon material, each of said sense amplifiers being connected to a corresponding one of said embedded elongated layers of heavily doped regions for amplifying electrical signals propagated along the sense line formed by the respective embedded elongated layer.

5. A random access memory device utilizing a matrix array of individual memory cells having orthogonally related word lines and sense lines, comprising in combination:

a substrate of semiconductor material of one conductivity type having a top surface which is at least partially planar;

a plurality of capacitance means formed at said planar surface, each of said capacitance means being partially formed by an elongated strip of conductive material deposited on said surface of said semiconductor substrate and insulated therefrom by a relatively thin insulating layer, each of said elongated strips of conductive material forming the storage gate for a plurality of cells defining a respective column of cells within said matrix of cells, said insulating layer defining the gate oxide, and said capacitance means further including storage regions within said surface underlying each of said elongated strips of conductive material;

said semiconductor substrate being provided with a plurality of parallel V-grooves in said top planar surface thereof, each of said V-grooves being located adjacent a corresponding one of said storage regions and the bottoms of said V-grooves extending into said semiconductor substrate;

a plurality of transistor means forming a plurality of transfer regions within said semiconductor substrate, each of said transistor means being defined in a side wall of a corresponding V-groove by one of said elongated strips of conductive material lying within said V-groove and separated from said side wall thereof by a relatively thin insulating layer, each of said transfer regions including a source to drain path located within said semiconductor substrate adjacent the side wall of the corresponding V-groove, a respective storage region being located at one end of said path of the corresponding transfer region;

a plurality of sense regions formed by heavily doped regions of the opposite conductivity type with respect to said semiconductor substrate, said heavily doped regions being in the form of spaced elongated layers embedded within said semiconductor substrate in orthogonal relationship to said elongated strips of conductive material and underlying said storage regions and said transfer regions, the bottoms of said plurality of V-grooves contacting each of said spaced elongated layers of heavily doped regions, each of said sense regions being located at the other end of the source to drain path of said transfer region corresponding thereto; and the sense regions included in each one of the embedded elongated layers forming the sense lines for a plurality of cells defining respective rows of cells within said matrix of cells, and the elongated strips of conductive material forming the word lines for a plurality of cells defining respective columns of cells within said matrix of cells.

* * * * *